(12) United States Patent
Kanno et al.

(10) Patent No.: US 7,279,834 B2
(45) Date of Patent: Oct. 9, 2007

(54) ORGANIC ELECTROLUMINESCENT DISPLAY APPARATUS AND METHOD OF FABRICATING THE SAME

(75) Inventors: Hiroshi Kanno, Osaka (JP); Yuji Hamada, Nara (JP); Hiroshi Matsuki, Gifu (JP); Yoshitaka Nishio, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 676 days.

(21) Appl. No.: 10/669,639

(22) Filed: Sep. 25, 2003

(65) Prior Publication Data

US 2006/0170339 A1 Aug. 3, 2006

(30) Foreign Application Priority Data

Sep. 27, 2002 (JP) .............................. 2002-284195

(51) Int. Cl.
H05B 33/00 (2006.01)

(52) U.S. Cl. .................. 313/504; 313/506; 445/23; 428/917

(58) Field of Classification Search ................ 313/504, 313/506; 428/917; 315/169.3; 345/36, 345/45, 76
See application file for complete search history.

(56) References Cited

U.S. PATENT DOCUMENTS

| | | | |
|---|---|---|---|
| 6,366,025 B1 | 4/2002 | Yamada | |
| 6,541,130 B2 | 4/2003 | Fukuda | |
| 6,690,110 B1 * | 2/2004 | Yamada et al. | 313/506 |
| 6,699,739 B2 | 3/2004 | Yamazaki et al. | |
| 6,940,222 B2 * | 9/2005 | Sakurai | 313/500 |
| 6,995,517 B2 * | 2/2006 | Yokoyama | 315/169.3 |
| 2002/0078847 A1 | 6/2002 | Bardet | |
| 2004/0144978 A2 | 7/2004 | Koyama | |
| 2004/0171182 A1 | 9/2004 | Yamazaki et al. | |
| 2005/0002260 A1 | 1/2005 | Koyama | |

FOREIGN PATENT DOCUMENTS

| | | |
|---|---|---|
| JP | 11-214157 | 8/1999 |
| JP | 2000-323277 A | 11/2000 |
| JP | 2001-93667 A | 4/2001 |
| JP | 2001-189192 A | 7/2001 |
| JP | 2001-282137 | 10/2001 |
| JP | 2001-290441 | 10/2001 |
| JP | 2001-345177 A | 12/2001 |
| JP | 2002-110345 A | 4/2002 |
| JP | 2002-151269 A | 5/2002 |
| JP | 2002-175878 | 6/2002 |
| JP | 2002-251166 | 9/2002 |
| JP | 2003-249366 A | 9/2003 |

\* cited by examiner

*Primary Examiner*—Ashok Patel
(74) *Attorney, Agent, or Firm*—McDermott Will & Emery LLP

(57) ABSTRACT

The light emitting layers and the electron transporting layers of R pixels, G pixels, and B pixels are formed to have a stripe shape extending in the column direction. The red light emitting layer and the electron transporting layer in R pixels are formed to be continuous layers using the same mask in a first vapor deposition chamber, the green light emitting layer and the electron transporting layer of G pixels are formed to be continuous layers using the same mask in a second vapor deposition chamber, and the blue-white light emitting layer and the electron transporting layer of B pixels are formed to be continuous layers using the same mask in a third vapor deposition chamber.

12 Claims, 4 Drawing Sheets

ORGANIC ELECTROLUMINESCENT DISPLAY APPARATUS AND METHOD OF FABRICATING THE SAME

BACKGROUND OF THE INVENTION

1. Field of the Invention

The present invention relates to an organic electroluminescent display apparatus comprising a plurality of organic electroluminescent devices and a method of fabricating the same.

2. Description of the Background Art

Organic electroluminescent display apparatuses (hereinafter abbreviated to organic EL display apparatuses) are expected to be promising as display apparatuses in place of liquid crystal display apparatuses currently in widespread use, and the development for practical utilization is under way. In particular, active matrix organic EL display apparatuses comprising Thin Film Transistors (TFTs) as switching devices in respective pixels are capable of having larger screens and higher definition because of holding display data in each pixel, and are considered to be the leading apparatuses among the next generation flat panel displays.

An organic EL display apparatus includes a plurality of organic electroluminescent devices (hereinafter abbreviated to organic EL devices), and each organic EL device constitutes a pixel. In each organic EL device, electrons and holes are injected to a light emitting layer from an electron injecting electrode and a hole injecting electrode, respectively, to be recombined at an interface between the light emitting layer and the hole transporting layer or inside the light emitting layer near the interface. This causes organic molecules to be in an excited-state, and fluorescence is produced when the organic molecules in the excited-state return to the ground-state.

In an organic EL display apparatus, a plurality of organic EL devices are formed in the form of a matrix. A color organic EL display apparatus comprises pixels composed of organic EL devices emitting red light (hereinafter referred to as R pixels), pixels composed of organic EL devices emitting green light (hereinafter referred to as G pixels), and pixels composed of organic EL devices emitting blue light (hereinafter referred to as B pixels).

A plurality of R pixels, a plurality of G pixels, and a plurality of B pixels are arranged along one direction and the other direction intersecting at right angles with each other. Here, one direction and the other direction are named "row direction" and "column direction", respectively. In other words, a group of a plurality of R pixels, G pixels, and B pixels are periodically arranged along the row direction, and a plurality of R pixels, a plurality of G pixels, and a plurality of B pixels are arranged in the column direction, respectively.

Each organic EL device has a stacked structure in which a hole transporting layer, a light emitting layer, and an electron transporting layer are sequentially formed between a hole injecting electrode (anode) and an electron injecting electrode (cathode). The light emitting layers of R pixels, G pixels, and B pixels are composed of different materials.

In general, organic EL devices are formed by vacuum vapor deposition (see, for example, JP 2001-93667 A). In order to form an organic EL device in each pixel, a mask having apertures corresponding to respective pixels on the hole injecting electrodes on the substrate is provided so as to selectively deposit on the substrate the organic materials evaporated from vapor deposition sources corresponding to R pixels, G pixels, and B pixels.

However, deviation of the position of the mask may be caused in deposition of organic material layers using the mask having apertures corresponding to respective pixel. This deviation of the position of the mask may then lead to deviation of the positions of the organic material layers such as light emitting layers, consequently resulting in the narrowed effective light emitting area and the degradation of the yield of a product.

Furthermore, the thickness of the organic material layers may become ununiform due to the shadowing from end portions of the apertures of the mask. In this case, the thickness of the organic material layers, though almost uniform near the center portion, become smaller at the end portions of the apertures. This not only prevents the uniform light emitting properties, but causes the effective light emitting area to be reduced.

SUMMARY OF THE INVENTION

An object of this invention is to provide an organic electroluminescent display apparatus wherein the required accuracy of positioning the organic electroluminescent devices is alleviated, so that the yield can be improved, the effective light emitting area can be prevented from being reduced, and the uniform light emitting properties can be ensured, and a method of fabricating the same.

An organic electroluminescent display apparatus according to one aspect of the instant invention comprises a plurality of organic electroluminescent devices constituting a plurality of pixels of different colors, wherein each organic electroluminescent device includes a first electrode, a light emitting layer, a first carrier transporting layer and a second electrode in this order; and the light emitting layer and the first carrier transporting layer are formed to be continuous layers, respectively in at least two of the adjacent organic electroluminescent devices constituting pixels of the same color.

In the organic electroluminescent display apparatus according to the present invention, the light emitting layers and the first carrier transporting layers are formed to be continuous layers, respectively, in at least two of the adjacent organic electroluminescent devices constituting pixels of the same color, so that the required accuracy of positioning the light emitting layers and the first carrier transporting layers is alleviated in the extending direction. Accordingly, the yield can be improved while the effective light emitting area can be prevented from being reduced. Moreover, in formation of the light emitting layers and the first carrier transporting layers using a mask, the thickness of the light emitting layers and the thickness of the first carrier transporting layers become uniform, respectively at least in the extending direction without the shadowing from an end portion of an aperture of the mask being caused. Accordingly, the uniform light emitting properties can be ensured.

A plurality of pixels are arranged in the form of a matrix such that the pixels of the same color are arranged along the column direction and the pixels of different colors are periodically arranged along the row direction, and the light emitting layers and the first carrier transporting layers of at least two organic electroluminescent devices in each column may be formed to be striped layers, respectively.

In this case, the required accuracy of positioning the light emitting layers and the first carrier transporting layers in the column direction is alleviated. Accordingly, the yield can be improved while the effective light emitting area can be prevented from being reduced. Moreover, in formation of the light emitting layers and the first carrier transporting layers using the mask, the thickness of the light emitting layers and the thickness of the first carrier transporting layers, respectively become uniform at least in the column direction without the shadowing from an end portion of an aperture of the mask being caused. Accordingly, the uniform light emitting properties can be ensured.

The organic electroluminescent display apparatus may further comprise second carrier transporting layers between the first electrodes and the light emitting layers, the first electrodes of the organic electroluminescent devices, constituting respective pixels may be independently formed, and the second carrier transporting layers of a plurality of organic electroluminescent devices constituting at least two pixels may be formed to be a continuous layer.

In this case, an area of the light emitting layer located on each first electrode corresponds to a light emitting area. Since the second carrier transporting layers of at least two of the organic electroluminescent devices are formed to be a continuous layer, high accuracy of positioning of the second carrier transporting layer is not required. Accordingly, the yield can be improved while the uniform light emitting properties can be ensured.

An area separating adjacent pixels along the row direction may be provided, and the interface between the light emitting layers and the interface between the first carrier transporting layers of adjacent organic electroluminescent devices in the row direction may be located on the area. Here, "an area separating adjacent pixels" means a non-light emitting area that exists between adjacent organic electroluminescent devices, which corresponds to an area between the first electrodes of adjacent organic electroluminescent devices.

In this case, even if the positions of the light emitting layers and the first carrier transporting layers of the organic electroluminescent devices deviate a bit in the column direction, the effective light emitting area is not reduced. Accordingly, the sufficient effective light emitting area can be ensured as well as the uniform light emitting properties can be ensured.

The light emitting layers and the first carrier transporting layers of the organic electroluminescent devices constituting pixels of at least two colors may contain the same organic material.

In this case, in formation of the light emitting layers and the first carrier transporting layers of the organic electroluminescent devices constituting pixels of at least two colors, the light emitting layers and the first carrier transporting layers can be successively formed in the same chamber without switching the organic material source for each color of pixels. Therefore, the fabrication time and the fabrication cost can be reduced.

The first carrier transporting layers of the organic electroluminescent devices constituting pixels of at least two colors may differ in thickness from each other. In this case, the optimum light emitting efficiencies for each color of pixels can be attained.

A method of fabricating an organic electroluminescent display apparatus comprising a plurality of organic electroluminescent devices constituting a plurality of pixels of different colors according to the present invention, comprises, in the following order, the steps of forming a first electrode of each organic electroluminescent device; forming light emitting layers to be a continuous layer in at least two of adjacent organic electroluminescent devices constituting the pixels of the same color; forming first carrier transporting layers to be a continuous layer in at least two of the adjacent organic electroluminescent devices constituting the pixels of the same color; and forming a second electrode of each organic electroluminescent device.

According to the method of fabricating the organic electroluminescent apparatuses of the present invention, the light emitting layers and the first carrier transporting layers are formed to be continuous layers, respectively, in at least two of adjacent organic electroluminescent devices constituting pixels of the same color, so that the required accuracy of positioning the light emitting layers and the first carrier transporting layers is alleviated in the extending direction. Accordingly, the yield can be improved while the effective light emitting area can be prevented from being reduced. Moreover, in formation of the light emitting layers and the first carrier transporting layers using a mask, the thickness of the light emitting layers and the thickness of the first carrier transporting layers become uniform, respectively at least in the extending direction without the shadowing from an end portion of an aperture of the mask being caused. Accordingly, the uniform light emitting properties can be ensured.

The plurality of pixels may be arranged in the form of a matrix such that the pixels of the same color are arranged along the column direction and the pixels of the different colors are periodically arranged along the row direction, and the step of forming light emitting layers to be a continuous layer may include the step of forming the light emitting layers of at least two organic electroluminescent devices in each column to be a striped layer, and the step of forming first carrier transporting layers to be a continuous layer may include the step of forming the first carrier transporting layers of at least two organic electroluminescent devices in each column to be a striped layer.

In this case, the light emitting layers and the first carrier transporting layers are formed to be a striped layer so as to the required accuracy of positioning the light emitting layers and the first carrier transporting layers in the column direction. Accordingly, the yield can be improved while the effective light emitting area can be prevented from being reduced. Moreover, because of the formation of the light emitting layers and the first carrier transporting layers, the thickness of the light emitting layers and the thickness of the first carrier transporting layers become uniform, respectively, at least in the column direction without the shadowing from an end portion of an aperture of the mask being caused. Accordingly, the uniform light emitting properties can be ensured. In addition, because the light emitting layers and the first carrier transporting layers of the pixels of the same color can be formed to be continuous layers using the same mask, the fabrication time and the fabrication cost can be reduced.

The step of forming a first electrode may include the step of independently forming first electrode of the organic electroluminescent device constituting each pixel, and the method may further comprise the step of forming, on a plurality of the first electrodes, the second carrier transporting layers of a plurality of organic electroluminescent devices constituting at least two pixels to be a continuous layer. In this case, an area of the light emitting layer located on each of the first electrodes corresponds to a light emitting area. Since the second carrier transporting layer is formed to be a continuous in at least two of the organic electroluminescent devices, high accuracy of positioning of the second carrier transporting layers. Accordingly, the yield can be improved while the uniform light emitting properties can be ensured.

The organic electroluminescent display apparatus may comprise an area separating adjacent pixels along the row direction, and the step of forming light emitting layers to be a continuous layer may include the step of forming the light emitting layers such that the interface between the light emitting layers of adjacent organic electroluminescent devices along the row direction is located on the area, and the step of forming first carrier transporting layers to be a continuous layer may include the step of forming the first carrier transporting layers the interface between the first carrier transporting layers of adjacent organic electroluminescent devices along the row direction is located on the area.

In this case, even if the light emitting layers and the first carrier transporting layers of the organic electroluminescent devices deviate in the column direction, the effective light emitting area is not reduced. Accordingly, the sufficient effective light emitting area can be ensured as well as the uniform light emitting properties can be ensured.

The step of forming light emitting layers to be a continuous layer and the step of forming first carrier transporting layers to be a continuous layer may include the step of forming successively the light emitting layers and the first carrier transporting layers in the same chamber for each color of pixels. Thus, the fabrication time and the fabrication cost can be reduced.

The step of forming first carrier transporting layers may include the step of forming the first carrier transporting layers of the organic electroluminescent devices constituting pixels of at least two different colors so as to be different in thickness from each other. In this case, the optimum light emitting efficiencies of the pixels of each color can be attained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Description is now made of an organic electroluminescent display apparatus (hereinafter referred to as an organic EL display apparatus) according to an embodiment of the present invention.

Figure 1:
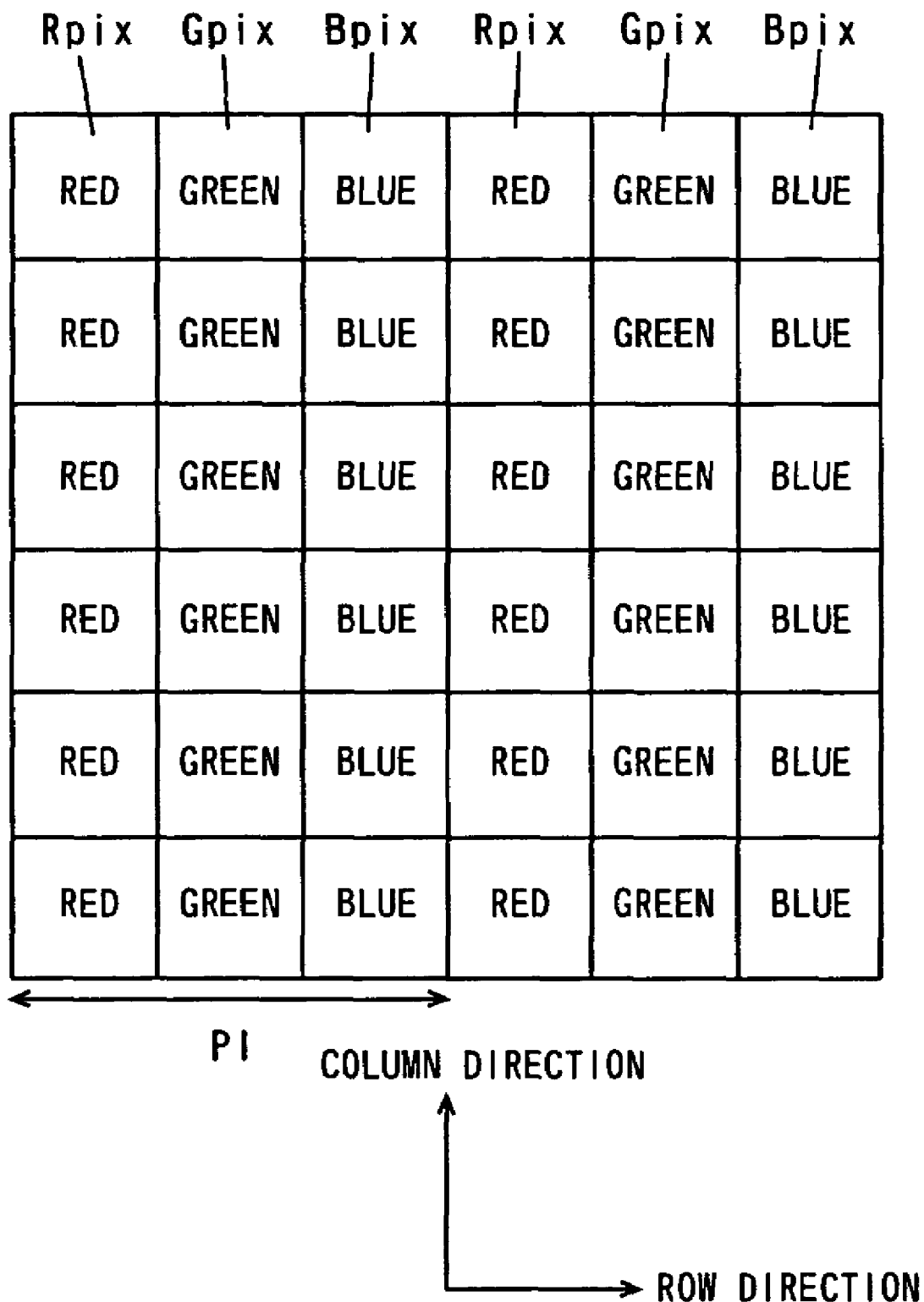
FIG. 1 is a schematic plan view showing the arrangement of pixels of an organic EL display apparatus according to one embodiment of the present invention.

FIG. 1 is a schematic plan showing the arrangement of pixels of an organic EL display apparatus according to one embodiment of the present invention. Organic EL display apparatuses are composed of a plurality of organic electroluminescent devices (hereinafter referred to as organic EL devices).

In the organic EL display apparatus shown in FIG. 1, Rpix, which are pixels emitting red light (hereinafter referred to as R pixels), Gpix, which are pixels emitting green light (hereinafter referred to as G pixels), and Bpix, which are pixels emitting blue light (hereinafter referred to as B pixels) are arranged in the form of a matrix.

R pixels Rpix are composed of the organic EL devices emitting red light, G pixels Gpix are composed of the organic EL devices emitting green light, and B pixels Bpix are composed of the organic EL devices emitting blue light.

Here, one direction and the other direction crossing at right angles are named "row direction" and "column direction" respectively. A plurality of sets Rpixels Rpix, Gpixels Gpix, and B pixels Bpix are arranged periodically along the row direction, and a plurality of R pixels Rpix, a plurality of G pixels Gpix, and a plurality of B pixels Bpix are arranged, respectively, along the column direction. Namely, the pixels of the same color are arranged in the column direction.

In the row direction, PI represents a pitch of R pixels Rpix, and likewise represents G pixels Gpix, and B pixels Bpix.

The size of a pixel in the row direction will be named "pixel width", and that in the column direction will be named "pixel length" in the following description. As described below, R pixels Rpix, G pixels Gpix, and B pixels Bpix differ in width in the row direction.

Next, description is made of masks which are used in forming a light emitting layer and an electron transporting layer of the organic EL devices in an organic EL display apparatus according to this embodiment. Since R pixels Rpix, G pixels Gpix, and B pixels Bpix differ in width in the row direction as described above, masks for R pixels Rpix, G pixels Gpix, and B pixels Bpix, are prepared respectively.

In fabricating the conventional organic EL devices, masks having descrete apertures each corresponding to each pixel are used. Masks used in this embodiment, on the other hand, have a plurality of apertures to be used in common between a plurality of adjacent pixels in the column direction. The pitch of an aperture is equal to the pitch PI between the pixels of the same color in the row direction.

For example, an aperture is used in common between a plurality of adjacent R pixels Rpix in the column direction. Likewise, an aperture is used in common between a plurality of adjacent G pixels Gpix in the column direction, and an aperture is used in common between a plurality of adjacent B pixels Bpix in the column direction.

The width of an aperture corresponds to the width of one pixel. That is, the width of an aperture for the mask for R pixels Rpix corresponds to the width of one R pixel Rpix, the width of an aperture for G pixels Gpix corresponds to the width of one G pixel Gpix, and the width of an aperture for the mask for B pixels Bpix corresponds to the width of one B pixel Bpix.

Furthermore, the length of an aperture is determined depending on the number of pixels used in common. Namely, in the case where the light emitting layer and the electron transporting layer of two adjacent pixels are used in common, the length of an aperture is set to the length of a pixel×2. In the case where the light emitting layer and the electron transporting layer of n (n is an arbitrary integer not less than two) adjacent pixels are used in common, the length of an aperture is set to the length of a pixel×n. In this embodiment, assuming that k represents the number of all the pixels in the column direction, the length of an aperture is set to the length of a pixel×k so as to allow all the pixels arranged in the column direction to be used in common the light emitting layer and the electron transporting layer.

The thickness of each mask for R pixels Rpix, G pixels Gpix, and B pixels Bpix is, for example, 50 μm.

Deposition of organic materials using such masks enables the light emitting layers and electron transporting layers of R pixels Rpix, G pixels Gpix, and B pixels Bpix, to form striped layers extending respectively, in the column direction.

Figure 2:
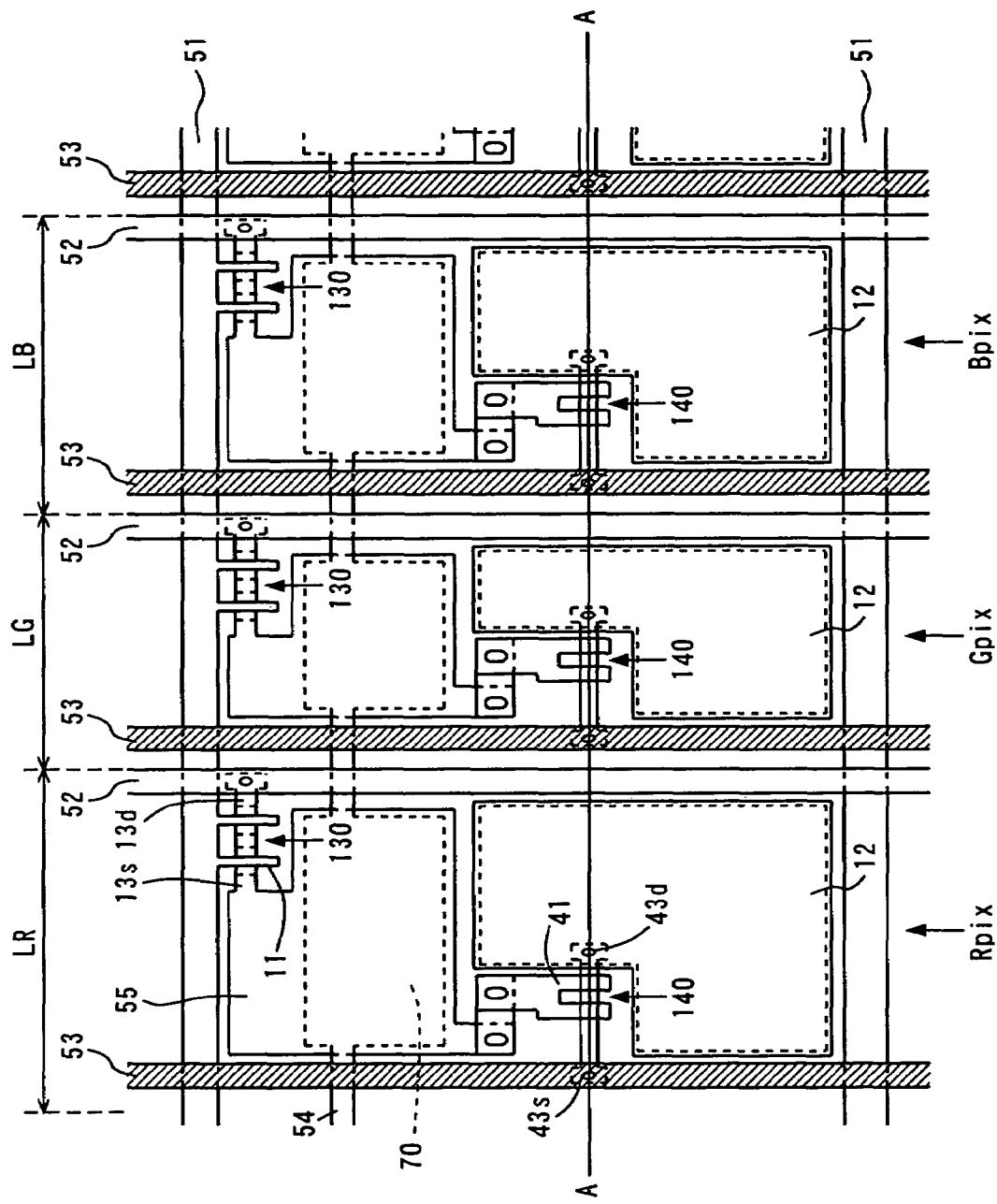
FIG. 2 is a plan view of organic EL devices, constituting respectively a single set of R pixel, G pixel, and B pixel of the organic EL display apparatus according to the embodiment.
Figure 3:
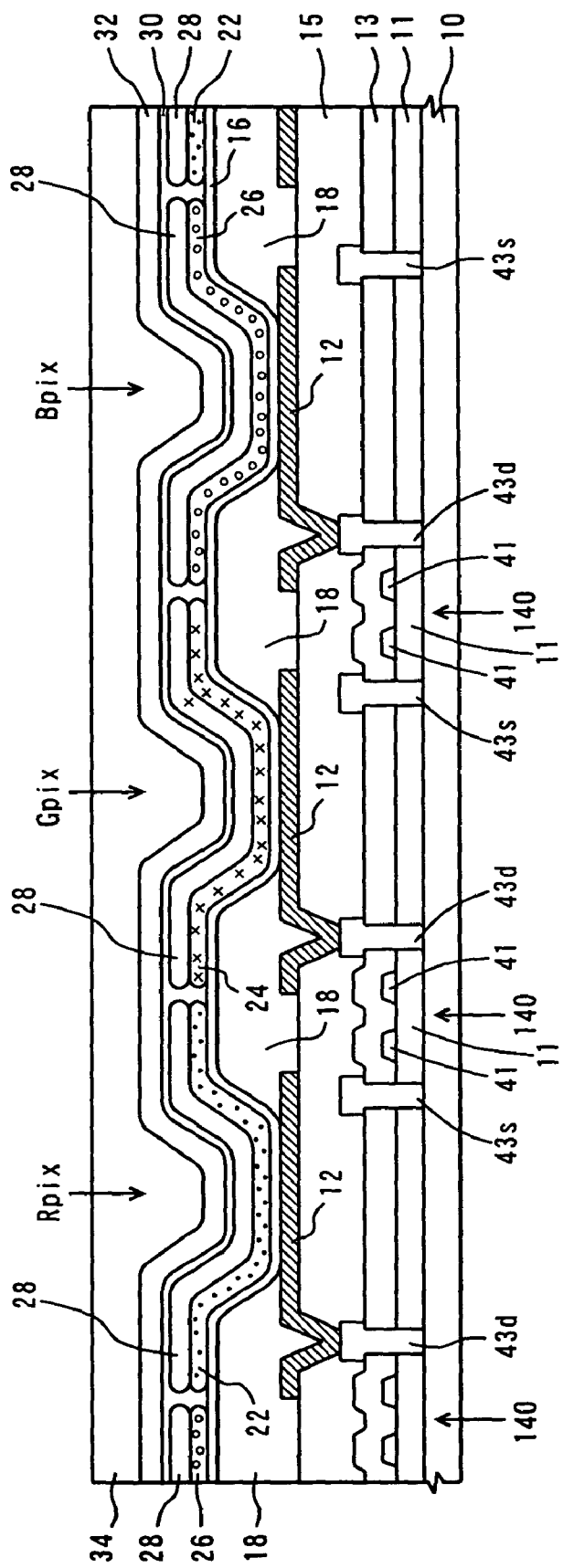
FIG. 3 is an A-A line cross-sectional view of the organic EL display apparatus shown in FIG. 2.

FIG. 2 is a plan view of the organic EL devices, constituting respectively a single set of R pixel, G pixel, and B pixel of the organic EL display apparatus according to this embodiment. FIG. 3 is an A-A line cross-sectional view of the organic EL display apparatus shown in FIG. 2.

FIG. 2 shows, in sequence from the left, an R pixel Rpix comprising a red light emitting layer, a G pixel Gpix comprising a green light emitting layer, and a B pixel Bpix comprising a blue light emitting layer.

The structure of each pixel is identical in the plan view. A pixel is formed in an area surrounded by two gate signal lines 51 extending in the row direction and two drain signal lines (data lines) 52 extending in the column direction. In the area of each pixel, an n-channel type first TFT 130, which serves as a switching device, is formed near the intersection of the gate signal line 51 and the drain signal line 52, and a p-channel type second TFT 140, which serves to drive the organic EL device, is formed near the center. In addition, an auxiliary electrode 70, and a hole injecting electrode 12 composed of Indium Tin Oxide (ITO) are formed in the area of each pixel. An organic EL device is formed in the form of an island in the area of the hole injecting electrode 12.

The first TFT 130 has its drain connected to the drain signal line 52 through a drain electrode 13d, its source connected to an electrode 55 through a source electrode 13s. A gate electrode 11 of the first TFT 130 extends from the gate signal line 52.

Figure 4:
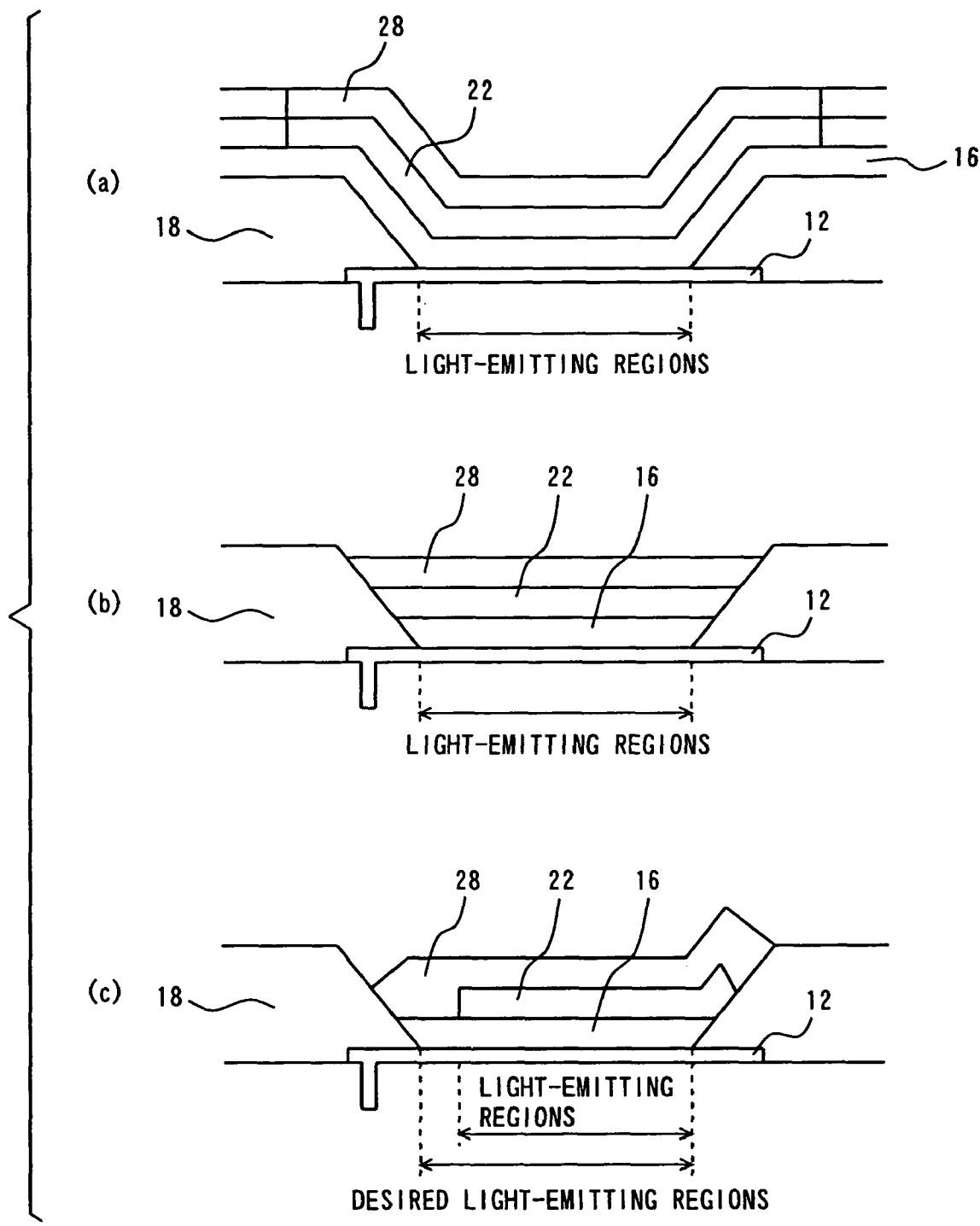
FIG. 4 is a schematic view showing the cross-sectional structure of the organic EL device in the organic EL display apparatus of this embodiment in comparison with the cross-sectional structure of an organic EL device having a conventional structure.

An auxiliary capacitance 70 is composed of an Sc line 54 receiving a power voltage Vsc and an electrode 55 integrated with an active layer 11 (see FIG. 4).

The second TFT 140 has its drain connected to the hole injecting electrode 12 through a drain electrode 43d, its source connected to a power source line 53 extending in the column direction, through a source electrode 43s. A gate electrode 41 of the second TFT 140 is connected to the electrode 55.

The width LR of an R pixel Rpix, LG of a G pixel Gpix, and LB of a B pixel Bpix are set, respectively, to equalize the amounts of light from the R pixel Rpix, G pixel G pix, and B pixel Bpix in consideration of the light emitting efficiency of each organic EL device. In this embodiment, The width LR of an R pixel Rpix is 75.5 μm, LG of a G pixel Gpix is 56.5 μm, and LB of a B pixel Bpix is 66 μm.

As shown in FIG. 3, the active layer 11 composed of polycrystalline silicon and the like is formed on a glass substrate 10, a part of which is the second TFT 140 serving to drive the organic EL device. A gate electrode 41 having a double-gate structure is formed on the active layer 11 with a gate oxide film (not illustrated) interposed therebetween, and an inter-layer insulating film 13 and a first flat layer 15 are formed on the active layer 11 to cover the gate electrode 41. An example of materials of the first flat layer 15 is an acrylic resin. The transparent hole injecting electrode 12 is formed on the first flat layer 15 in each pixel, and an insulating second flat layer 18 is formed on the first flat layer 15 to cover the hole injecting electrode 12.

The second TFT 140 is formed under the second flat layer 18. Note that the second flat layer 18 is not formed on the whole surface of the hole injecting electrode 12; it is formed to cover the area where the second TFT 140 is formed, and is formed locally in the shape of the second flat layer so as to avoid the disconnection of the hole injecting electrode 12 or each organic material layer shown below.

A hole transporting layer 16 is formed over the whole area to cover the hole injecting layer 12 and the second flat layer 18.

On the hole transporting layers 16 of the R pixel Rpix, G pixel Gpix, and B pixel Bpix, a red light emitting layer 22, green light emitting layer 24, and blue light emitting layer 26 are formed, respectively, to have a stripe shape extending in the column direction.

The interfaces between the striped red light emitting layer 22, striped green light emitting layer 24, and striped blue light emitting layer 26 are provided in the area on the surface of the second flat layer 18 in parallel with the glass substrate 10.

On each of the red light emitting layer 22, green light emitting layer 24, and blue light emitting layer 26 of the R pixel Rpix, G pixel Gpix, and B pixel Bpix, a striped electron transporting layer 28 is formed extending in the column direction.

The light emitting layers 22, 24 and 26, and the electron transporting layer 28 of the R pixel Rpix, G pixel Gpix, and B pixel Bpix are formed to be continuous layers, for each color, in the multi-chamber type organic EL manufacturing apparatus comprising a plurality of vapor deposition chambers. Namely, the red light emitting layer 22 and the electron transporting layer 28 of the R pixel Rpix are formed to be a continuous layer using the same mask in a first vapor deposition chamber. The green light emitting layer 24 and the electron transporting layer 28 of the G pixel Gpix are formed to be a continuous layer using the same mask in a vapor deposition chamber. The blue light emitting layer 26 and the electron transporting layer 28 of the B pixel Bpix are formed to be a continuous layer using the same mask in a third vapor deposition chamber. Thus, the interfaces between the electron transporting layers 28 are provided to overlap the interfaces between the red light emitting layer 22, the green light emitting layer 24, and the blue light emitting layer 26.

Such formation of each of the light emitting layers 22, 24, 26, and the electron transporting layer 28 in different vapor deposition chambers for each color, as described before, can avoid the cross-contamination of dopants, which is caused by forming the three kinds of light emitting layers 22, 24, 26, and the electron transporting layer 28 in the same vapor deposition chamber.

Furthermore, a lithium fluoride layer 30 and an electron injecting electrode 32 are formed, in sequence, on each of the electron transporting layers 28.

In such an organic EL display apparatus, when a selection signal is output to the gate signal line 51, the first TFT 130 turns on, and in response to a voltage value (data signal) supplied to the drain signal line 52, the auxiliary capacity 70 is charged. The gate electrode 41 of the second TFT 140 receives a voltage corresponding to a charge charged in the auxiliary capacity 70. Thus a current supplied to the organic EL device from the power source line 53 is controlled, so that the organic EL device emits light with a luminance corresponding to the current supplied.

Examples of the material usable for the hole injecting electrode 12 may be ITO, oxide tin (SnO2), oxide indium (In2O3), and so forth.

An example of the material usable for the hole transporting layer 16 is N,N'-Di(naphthalene-1-yl)-N,N'-diphenyl-benzidine (hereinafter referred to as NPB) having a molecular structure expressed by Formula (1):

(1)

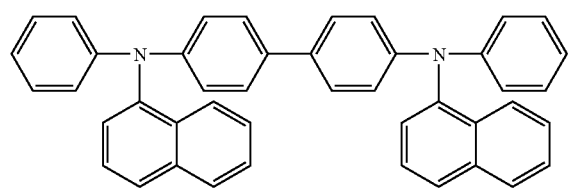

Another example of the material usable for the hole transporting layer 16 may be 4,4',4''-tris(3-methylphenylphenylamino)triphenylamine (MTDATA) having a molecular structure expressed by Formula (2):

(2)

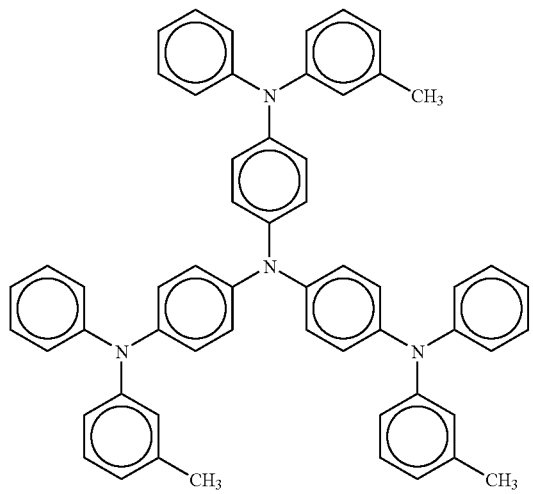

Still another example of the material usable for the hole transporting layer 16 may be N,N'-diphenyl-N,N'-di(3-methylphenyl)-1,1'-biphenyl-4,4'-diamine (TPD) having a molecular structure expressed by Formula (3).

Examples of the host materials usable for the red light emitting layer 22 and the green light emitting layer 24 may be chelate metal complexes, wherein a plurality of ligands are coordinated to one metal ion, such as an almiquinoline complex (Alq3) having a molecular structure expressed by Formula (4), and a Bis(benzoquinolinolato)beryllium complex (BeBq2) having a molecular structure expressed by Formula (5), and the like.

(3)

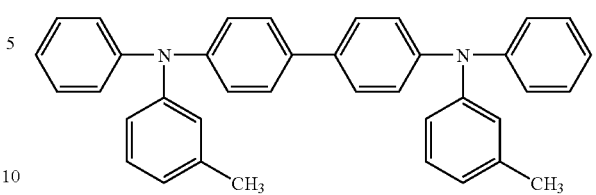

(4)

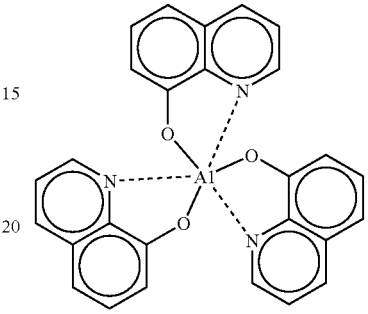

(5)

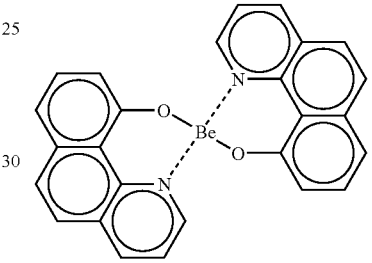

In general, organic EL devices formed of a chelate metal complex as a host material have difficulties in emitting blue light, which is a color of shortwavelength. Therefore, a condensation polycyclic aromatic group, such as acetone or its derivatives including tert-butyl substituted dinaphthylanthracene (hereinafter referred to as TBADN) having a molecular structure expressed by Formula (6), distylbenzen and its derivatives, and so forth is used as a host material of the blue light emitting layer 26.

(6)

[structure with C(CH3)3]

Furthermore, with one of the chelate metal complexes or the condenstion polycyclic aromatic group shown above, used as the host material, the organic EL devices of desired light emitting properties can be obtained by doping of dopants such as Rubrene having a molecular structure expressed by Formula (7), 2-(1,1-Dimethylethly)-6-(2-(2,3,6,7-tetrahydro-1,1,7,7-tetramethyl-1II, 5II-benzo[ij]quinolizin-9-yl)ethenyl)-4H-pyran-4-ylidene Propanedinitril (hereinafter referred to as DCJTB) having a molecular structure expressed by Formula (8), a quinacridone derivative having a molecular structure expressed by Formula (9), TBADN and so forth.

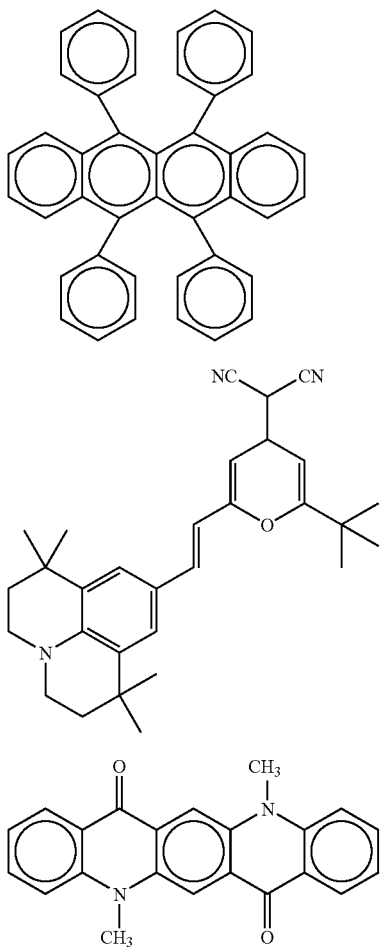

(7)

(8)

(9)

Examples of the material usable for the electron transporting layer 28 are chelate metal complexes such as Alq3, BeBq2 or the like.

Examples of the material usable for the electron injecting electrode 32 are an aluminium alloy containing a trace of aluminum and lithium, a magnesium-indium alloy, a magnesium-silver alloy and so forth. Furthermore, an electrode having a dual-layer structure composed of the lithium fluoride layer 30 and the electron injecting electrode 32 may be formed on the electrode transporting layer 28.

In the organic EL display apparatus of this embodiment, the striped red light emitting layer 22, striped green light emitting layer 24, and striped blue light emitting layer 26, are formed respectively to extend in the column direction on the hole transporting layers 16 of the pixels of each color, and the striped electron transporting layers 28 is formed in the column direction on the red light emitting layer 22, the green light emitting layer 24, and the blue light emitting layer 26, respectively. Accordingly, the required accuracy of positioning each of the light emitting layers 22, 24, 26 and electron transporting layers 28 is alleviated at least in the column direction. Moreover, each of the light emitting layers 22, 24, 26 and electron transporting layers 28 can be formed to be a continuous layer in the same vapor deposition chamber using the same mask.

Furthermore, the interfaces between the striped light emitting layers 22, 24, 26 of each color and the interfaces between the electron transporting layers 28 are provided in such areas not affecting the display. Therefore, the slight deviation in the positions of the light emitting layers 22, 24, 26 of each color and each electron transporting layer 28 toward the column direction does not make the actual light emitting area smaller.

FIG. 4 is a schematic view showing the cross-sectional structure of the organic EL device in the organic EL display apparatus of this embodiment in comparison with the cross-sectional structure of the organic EL device having a conventional structure. FIG. 4 shows, as a representative example, the organic EL device comprising the red light emitting layer 22, with the structure shown in FIG. 3 partly omitted in order to make the explanation simple.

FIG. 4(a) shows the structure of the organic EL device according to this embodiment in which the interface of the red light emitting layer 22 is formed over the second flat layer 18. FIG. 4(b) shows the conventional structure in which the red light emitting layer 22 is formed in an area almost equal to that of the light emitting area. FIG. 4(c) shows an example of the case where the deviation in the position of the red light emitting layer 22 has occurred due to the deviation in the position of the mask in formation of the organic EL device having the conventional structure.

As shown in FIG. 4(a), in this embodiment, the red light emitting layer 22 and the electron transporting layer 28 are formed over a wider range of area than the actual light emitting area. Organic El devices, in general, hardly emit light on the area on the second flat layer 18 where no hole injecting electrode 12 is provided. Therefore, the slight deviation in the positions of the light emitting layers 22 and the electron transporting layer 28 toward the column direction to does not make the actual light emitting area smaller. The yield of the product is not thus reduced by the positional deviation of the light emitting layers 22, 24, 26, and the electron transporting layer 28.

In the conventional structure, on the other hand, as shown in FIG. 4(b), the red light emitting layer 22 and the electron transporting layer 28 are formed within the actual light emitting area. Accordingly, only the slight positional deviation of the red light emitting layer 22 results in the smaller light emitting area. This deviation is attributed to the positional deviation of the mask, and therefore, the whole organic EL display apparatus exhibits red color of low luminance, such that the white balance of the image displayed by the organic EL display apparatus is lost. Therefore, such organic EL display apparatuses are counted as defective products of reduced yield.

Description is now made of the optimum thicknesses of the electron transporting layers 28 of the R pixel Rpix, G pixel Gpix, and B pixel Bpix.

In organic EL devices, the light emitted from the light emitting layer is intensified with all of the optical path lengths of organic material layers including the light emitting layer, underlayers (SiO2 and SiN), and a glass substrate satisfying one of the following formulas:

$$4\pi/\lambda(n_1d_1+n_2d_2+n_3d_3+\ldots+n_kc)=2m\pi \quad (A1)$$

or $$4\pi/\lambda(n_1d_1+n_2d_2+n_3d_3+\ldots+n_kd_k)=(2m-1)\pi \quad (A2)$$

wherein m is an integer, $n_1$-$n_k$ is the refractive index of each layer, and $d_1$-$d_k$ is the thickness of each layer. In addition, λ represents the superlarge wavelength of an electroluminescence, which is defined in the following range, for the light emissions of each color:

organic EL device emitting red light: λ=600-640 (nm)
organic EL device emitting green light: λ=510-550 (nm)
organic EL device emitting blue light: λ=430-480 (nm)

Here, based on the above Formula (A1) or (A2), the optimum thicknesses of the electron transporting layers 28 of the R pixel Rpix, G pixel Gpix, and B pixel Bpix in the organic EL display apparatus shown below will be found.

In the embodiment, the hole injecting electrode 12 is composed of ITO, and the hole transporting layer 16 is composed of NPB with a thickness of 1900 Å. Furthermore, a hole injecting layer composed of CuPc (copper phthalocyanine) with a thickness of 100 Å, and a CFx (carbon fluoride) thin film with a thickness of 10 Å formed by plasma CVD (plasma chemical vapor deposition) are provided between the hole injecting electrode 12 and the hole transporting layer 16.

In R pixels Rpix, the red light emitting layer 22 contains, as a host material, Tris(8-hydroxyguinolinato)aluminum (hereinafter referred to as Alq) having a molecular structure expressed by Formula (10), and is doped with 1.7% DCJTB, and 20% Rubrene. The red light emitting layer 22 has a thickness of 350 Å.

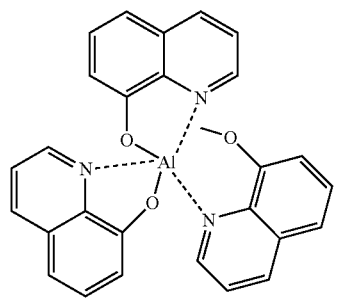

(10)

In G pixels Gpix, the green light emitting layer 24 contains, as a host material, Alq, and is doped with 0.7% 3,4-Difuluoro-N,N'-Dimethyl-quinacridone (hereinafter referred to as CFDMQA) having a molecular structure expressed by Formula (11), and 20% TBADN. The green light emitting layer 24 has a thickness of 350 Å.

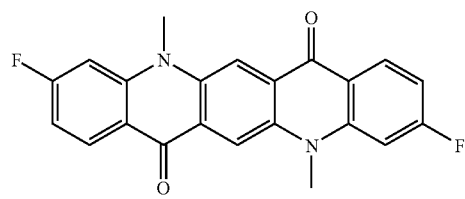

(11)

In B pixels Bpix, the blue light emitting layer 26 contains, as a host material, TBADN, and is doped with 1.5% tert-butyl substituted perylene (hereinafter referred to as TBP). The blue light emitting layer 26 has a thickness of 400 Å.

The electron transporting layer 28 is composed of Alq shown above. Furthermore, the lithium fluoride layer 30 has a thickness of 10 Å. The electron injecting electrode 32 is composed of Al with a thickness of 4000 Å.

It is found from the above Formula (A1) or (A2) that the optimum thickness of the electron transporting layer of R pixels Rpix is 250 Å, that of G pixels Gpix is 350 Å, and that of B pixels Bpix is 100 Å.

It is thus possible to attain the optimum light emitting efficiencies for each color by setting the thickness of the electron transporting layer 28 to its optimum value for each of R pixels Rpix, B pixels Gpix, and B pixels Bpix.

Furthermore, in R pixels Rpix and G pixels Gpix of this embodiment, the light emitting layer 22, 24, and the electron transporting layers 28 contain the same host material Alq, thereby eliminating the need to switch a deposition source in the first vapor deposition chamber and the second vapor deposition chamber.

In the embodiment, the hole injecting electrode 12 corresponds to a first electrode, the electron injecting electrode 32 corresponds to a second electrode, and the electron transporting layer 28 corresponds to a first carrier transporting layer, and the hole transporting layer 16 corresponds to a second carrier transporting layer.

The structure of the organic EL device of this invention can be replaced by various other structures without being limited to the one shown above. For example, an electron injecting layer may be provided between the electron transporting layer 28 and the electron injecting electrode 32.

Moreover, various well-known high molecular materials can be used as materials of the light emitting layer 22, 24, 26. In that case, the hole transporting layer 16 does not have to be provided.

It should be mentioned here that the red light emitting layer 22, green light emitting layer 24, and blue light emitting layer 26 of all the pixels in the column direction of each color may not necessarily be formed to be a continuous layer, but the red light emitting layer 22, green light emitting layer 24, and blue light emitting layer 26 of at least two pixels in the column direction of each color may be formed to be a continuous layer. That is, the pixels in the column direction of each color may be divided into a plurality of groups, wherein the red light emitting layers 22, green light emitting layers 24, and blue light emitting layers 26 of a plurality of pixels in each group, may be formed to be continuous layers. In this case, the interfaces between the groups are located in such areas not affecting the display.

The electron transporting layers 28 of all the pixels in the column direction of each color may not be formed to be a continuous layer, but the electron transporting layer 28 of at least two pixels in the column direction of each color may be formed to be a continuous layer. For example, the pixels in the column direction of each color may be divided into a plurality of groups, wherein the electron transporting layers 28 of a plurality of pixels in each group may be formed to be continuous layers. In this case, too, the interfaces between the groups are located in such areas not affecting the display.

Furthermore, the hole transporting layer 16 of all the pixels in the column direction of each color may not be formed to be a continuous layer, but the hole transporting layer 16 of at least two pixels in the column direction of each color may be formed to be a continuous layer. For example, the pixels in the column direction of each color may be divided into a plurality of groups, wherein the hole transporting layers 16 of a plurality of pixels in each group may be formed to be continuous layers. In this case, too, the interfaces between the groups are located in such areas not affecting the display.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An organic electroluminescent display apparatus comprising a plurality of organic electroluminescent devices constituting a plurality of pixels of different colors, wherein
each organic electroluminescent device includes a first electrode, a light emitting layer, a first carrier transporting layer and a second electrode in this order, and
said light emitting layer and said first carrier transporting layer are formed to be continuous layers, respectively, in at least two of the adjacent organic electroluminescent devices constituting pixels of the same color.

2. The organic electroluminescent display apparatus according to claim 1, wherein
said plurality of pixels are arranged in the form of a matrix such that the pixels of the same color are arranged along the column direction and the pixels of different colors are periodically arranged along the row direction, and
said light emitting layers and said first carrier transporting layers of at least two organic electroluminescent devices in each column are formed to be striped layers, respectively.

3. The organic electroluminescent display apparatus according to claim 2, wherein
each organic electroluminescent device further comprises a second carrier transporting layer between said first electrode and said light emitting layer,
each of said first electrodes of the organic electroluminescent devices constituting respective pixels is independently formed, and
said second carrier transporting layers in a plurality of organic electroluminescent devices constituting at least two pixels are formed to be a continuous layer.

4. The organic electroluminescent display apparatus according to claim 2, wherein
an area separating adjacent pixels along the row direction is provided, and
an interface between said light emitting layers and an interface between said first carrier transporting layers of adjacent organic electroluminescent devices in the row direction are located on said area.

5. The organic electroluminescent display apparatus according to claim 1, wherein
said light emitting layers and said first carrier transporting layers of the organic electroluminescent devices constituting pixels of at least two colors contain the same organic material.

6. The organic electroluminescent display apparatus according to claim 1, wherein
said first carrier transporting layers of the organic electroluminescent devices constituting pixels of at least two colors differ in thickness from each other.

7. A method of fabricating an organic electroluminescent display apparatus comprising a plurality of organic electroluminescent devices constituting a plurality of pixels of different colors, comprising, in the following order, the steps of:
forming a first electrode of each organic electroluminescent device;
forming light emitting layers of at least two of adjacent organic electroluminescent devices constituting the pixels of the same color to be a continuous layer;
forming first carrier transporting layers of at least two of adjacent organic electroluminescent devices constituting the pixels of the same color to be a continuous layer; and
forming a second electrode of each organic electroluminescent device.

8. The method of fabricating an organic electroluminescent display apparatus according to claim 7, wherein
said plurality of pixels are arranged in the form of a matrix such that the pixels of the same color are arranged along the column direction and the pixels of different colors are periodically arranged along the row direction, and
said step of forming light emitting layers to be a continuous layer include the step of forming said light emitting layers of at least two organic electroluminescent devices in each column to be a striped layer, and
said step of forming first carrier transporting layers to be a continuous layer include the step of forming said first carrier transporting layers of at least two organic electroluminescent devices in each column to be a striped layer.

9. The method of fabricating an organic electroluminescent display apparatus according to claim 8, wherein
said step of forming first electrodes includes the step of independently forming each of said first electrodes of the organic electroluminescent devices constituting respective pixels,
said method further comprising the step of forming, on a plurality of said first electrodes, said second carrier transporting layers of a plurality of organic electroluminescent devices constituting at least two pixels to be a continuous layer.

10. The method of fabricating an organic electroluminescent display apparatus according to claim 8, wherein
said organic electroluminescent display apparatus comprises an area separating adjacent pixels along the row direction, and
said step of forming light emitting layers to be a continuous layer includes the step of forming said light emitting layers such that an interface between said light emitting layers of adjacent organic electroluminescent devices along the row direction is located on said area, and
said step of forming first carrier transporting layers to be a continuous layer includes the step of forming said first carrier transporting layers such that an interface between said first carrier transporting layers of adjacent organic electroluminescent devices along the row direction is located on said area.

11. The method of fabricating an organic electroluminescent display apparatus according to claim 7, wherein
said step of forming light emitting layers to be a continuous layer and said step of forming first carrier transporting layers to be a continuous layer include the step of forming said light emitting layers and said first carrier transporting layers to be continuous layers in the same chamber for each color of the pixels.

12. The method of fabricating an organic electroluminescent display apparatus according to claim 7, wherein
said step of forming first carrier transporting layers to be a continuous layer includes the step of forming said first carrier transporting layers of the organic electroluminescent devices constituting pixels of at least two different colors to be different in thickness from each other.

* * * * *